United States Patent
Chang et al.

(10) Patent No.: US 10,468,331 B2
(45) Date of Patent: Nov. 5, 2019

(54) HEAT MANAGEMENT SYSTEM

(71) Applicant: Intel Corporation, Santa Clara, CA (US)

(72) Inventors: Je-young Chang, Phoenix, AZ (US); Jae W. Kim, Los Angeles, CA (US); Ravindranath V. Mahajan, Chandler, AZ (US); Blake Rogers, Mesa, AZ (US); Devdatta Kulkarni, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/869,700

(22) Filed: Jan. 12, 2018

(65) Prior Publication Data

US 2019/0221499 A1    Jul. 18, 2019

(51) Int. Cl.
| | | |
|---|---|---|
| *H01L 23/48* | (2006.01) | |
| *H01L 23/473* | (2006.01) | |
| *F28D 9/00* | (2006.01) | |
| *B23P 15/26* | (2006.01) | |
| *F28D 21/00* | (2006.01) | |
| *H01L 23/28* | (2006.01) | |
| *H01L 23/00* | (2006.01) | |
| *G06F 1/20* | (2006.01) | |

(52) U.S. Cl.
CPC .......... *H01L 23/473* (2013.01); *B23P 15/26* (2013.01); *F28D 9/0093* (2013.01); *F28D 21/0015* (2013.01); *G06F 1/203* (2013.01); *H01L 23/28* (2013.01); *H01L 24/17* (2013.01); *H01L 24/33* (2013.01); *H01L 2924/0002* (2013.01)

(58) Field of Classification Search
CPC .......... H01L 24/33; H01L 24/17; H01L 23/28
See application file for complete search history.

(56) References Cited

U.S. PATENT DOCUMENTS 9,761,508 B2 *  9/2017  Campbell .......... H05K 7/20436

* cited by examiner

*Primary Examiner* — Hoa B Trinh
(74) *Attorney, Agent, or Firm* — Schwegman Lundberg & Woessner, P.A.

(57) ABSTRACT

A heat management system may include a die package. The die package may include a housing. The housing may include a housing surface. The housing may include a housing inlet port. The housing inlet port may be in communication with the housing surface. The housing may include a housing outlet port. The housing outlet port may be in communication with the housing surface.

The heat management system may include a manifold. The manifold may be configured to couple with the housing. The manifold may include a manifold surface. The manifold surface may be configured to mate with the housing surface. The manifold may include a manifold inlet port. The manifold inlet port may be in communication with the manifold surface. The manifold may include a manifold outlet port. The manifold outlet port may be in communication with the manifold surface.

25 Claims, 8 Drawing Sheets

1400

1410
PLACING A FIRST MANIFOLD INCLUDING MANIFOLD COUPLING FEATURES PROXIMATE A FIRST HOUSING, THE HOUSING INCLUDING HOUSING COUPLING FEATURES CORRESPONDING IN ARRANGEMENT TO THE MANIFOLD COUPLING FEATURES;

1420
ALIGNING THE FIRST MANIFOLD COUPLING FEATURES WITH THE HOUSING COUPLING FEATURES; AND

1430
COUPLING THE FIRST MANIFOLD WITH THE FIRST HOUSING.

Fig. 14

HEAT MANAGEMENT SYSTEM

BACKGROUND

Die packages may include housings. The housings may include ports. The ports may be configured to facilitate the flow of a fluid through the housing.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIG. 14 illustrates a method for assembling an electronic system.

DETAILED DESCRIPTION

The present inventors have recognized, among other things, that a problem to be solved may include connections to ports in die package housing may leak fluid. The present inventors have recognized, among other things, that a problem to be solved may include threaded connections to the ports leaking fluid. The present subject matter may help provide a solution to this problem, such as by providing a heat management system.

The heat management system may include a die package. The die package may include a housing. The housing may be configured to allow a fluid to flow through the housing. The housing may include a housing surface. The housing may include a housing inlet port. The housing inlet port may be in communication with the housing surface. The housing may include a housing outlet port. The housing outlet port may be in communication with the housing surface. The fluid may flow from the housing inlet port, through the housing, and exit the housing outlet port.

The heat management system may include a manifold. The manifold may be configured to couple with the housing. The manifold may include a manifold surface. The manifold surface may be configured to mate with the housing surface. The manifold may include a manifold inlet port. The manifold inlet port may be in communication with the manifold surface. The manifold may include a manifold outlet port. The manifold outlet port may be in communication with the manifold surface.

The manifold may be coupled to the housing. Coupling the manifold to the housing may include placing the manifold surface in direct surface-to-surface contact with the housing surface. The manifold inlet port may be in communication with the housing inlet port. The manifold outlet port may be in communication with the housing outlet port. Coupling the manifold with the housing may provide a fluid-tight seal at the interface between the manifold inlet port and the housing inlet port. Coupling the manifold with the housing may provide a fluid-tight seal at the interface between the manifold outlet port and the housing outlet port. Coupling the manifold with the housing may eliminate the need for threaded couplings to be coupled with the housing. Eliminating the need for threaded couplings may decrease the probability that leaks may occur at the interface of the housing with the threaded couplings.

This overview is intended to provide an overview of subject matter of the present patent application. It is not intended to provide an exclusive or exhaustive explanation of the invention.

Figure 1:
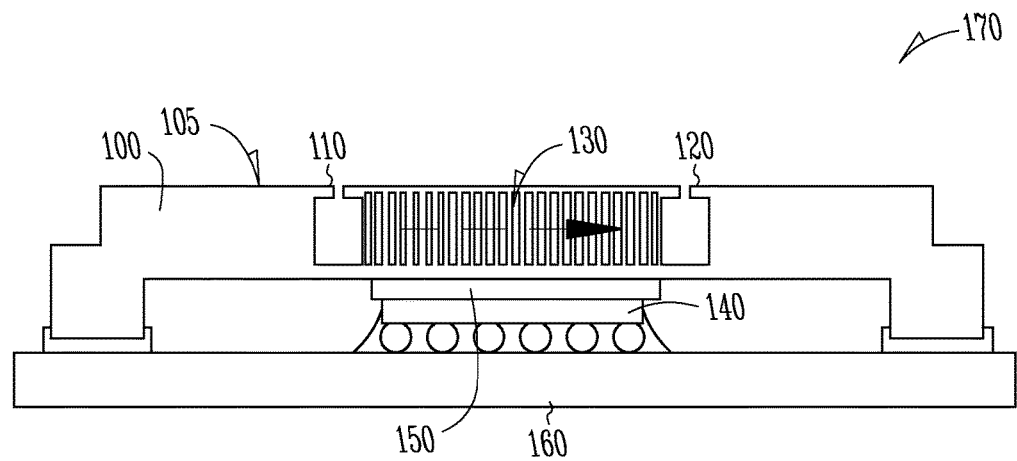
FIG. 1 illustrates an example of a die package.

FIG. 1 illustrates an example of a die package 170. The die package 170 may include a housing 100. The housing 100 may include an integrated heat spreader, a direct liquid micro jet, a cold plate, or the like. The housing 100 may include a housing surface 105. The housing surface 105 may be classified as a cooling surface. The housing surface 105 may be a planar surface or a substantially planar surface.

The housing 100 may be coupled to a substrate 160. The housing 100 may be coupled to a semiconductor die 140. The semiconductor die 140 may be coupled to the substrate 160. The assembly of the semiconductor die 140 and the housing 100 to the substrate 160 may create the die package 170. The die package 170 may include a processor.

The substrate 160 may include electrical contacts configured in an array (e.g., a ball grid array, a land grid array, or the like). The substrate 160 may be configured to route electrical signals to and from the semiconductor die 140. The semiconductor die 140 may produce heat during operation. The coupling of the housing 100 to the semiconductor die 140 may transfer the heat produced by the semiconductor die 140 to the housing 100. A thermal interface material 150 may be applied at the interface between the housing 100 and the semiconductor die 140. The thermal interface material 150 may improve the rate of heat transfer between the semiconductor die 140 and the housing 100.

Figure 2:
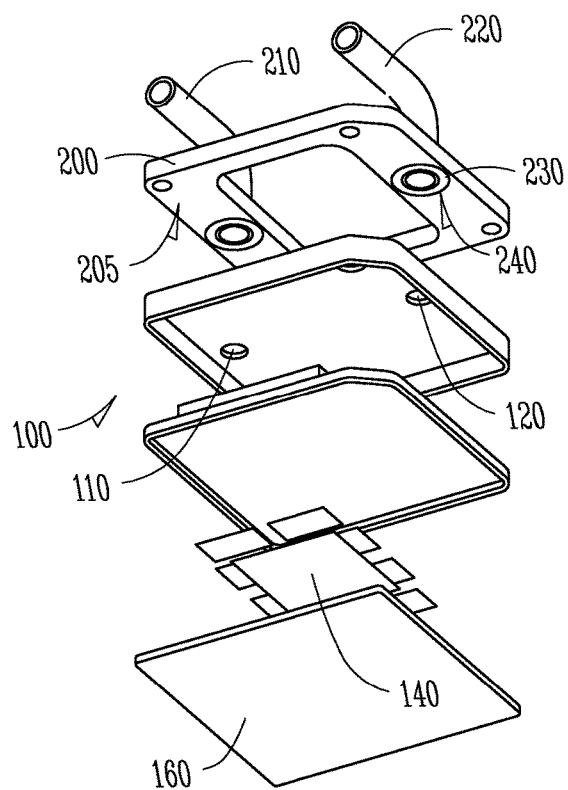
FIG. 2 illustrates an example of a first heat management system.

The housing 100 may include a housing inlet port 210. The housing inlet port 110 may be in communication with the housing surface 105. The housing inlet port 110 may be configured to open into the housing surface 105. The housing inlet port 110 may be included in a plurality of housing inlet ports. The plurality of housing inlet ports may be in communication with the housing surface 105. The housing inlet port 110 and the housing outlet port 120 include smooth openings to the housing surface 105, such as by lacking threads formed in the housing inlet port 110 and the housing outlet port 120. As shown in FIG. 2, a smooth transition may optionally exist at the interface of the housing inlet port 110 and the housing outlet port 120 with the housing surface 105.

The housing 100 may include a housing outlet port 120. The housing outlet port 120 may be in communication with the housing surface 105. The housing outlet port 120 may be configured to open into the housing surface 105. The housing outlet port 120 may be included in a plurality of housing outlet ports. The plurality of housing outlet ports may be in communication with the housing surface 105.

The housing 100 may include a plurality of channels 130. The plurality of channels 130 may be configured to alter the flow of a fluid (e.g., a working fluid) within the housing 100. The fluid may include water, antifreeze, refrigerant, or the like). The plurality of channels 130 may be in communication with the housing inlet port 110. The plurality of channels 130 may be in communication with the housing outlet port 120. The fluid may flow from the housing inlet port 110 to the housing outlet port 120. The fluid flowing within the housing 100 may cool the housing 100. Cooling of the housing 100 may cool the semiconductor die 140.

FIG. 2 illustrates an example of a first heat management system 250. The first heat management system 250 may include the housing 100. The first heat management system 250 may include a manifold 200. The manifold 200 may be configured to couple with the housing 100. The manifold 200 may include a manifold surface 205. The manifold surface 205 may be configured to mate with the housing surface 105. The manifold surface 205 may be a planar surface or a substantially planar surface.

The manifold 200 may include a manifold inlet port 210. The manifold inlet port 210 may be in communication with the manifold surface 205. The manifold inlet port 210 may be configured to open into the manifold surface 205. The manifold inlet port 210 may be included in a plurality of manifold inlet ports. The plurality of manifold inlet ports may be in communication with the manifold surface 205.

The manifold 200 may include a manifold outlet port 220. The manifold outlet port 220 may be in communication with the manifold surface 205. The manifold outlet port 220 may be configured to open into the manifold surface 205. The manifold inlet port 210 may be included in a plurality of manifold outlet ports. The plurality of manifold outlet ports may be in communication with the manifold surface 205.

The manifold 200 may be coupled to the housing 100. Coupling the manifold 200 to the housing 100 may include placing the manifold surface 205 in direct surface-to-surface contact with the housing surface 105. The coupling of the manifold 200 to the housing 100 may include biasing the manifold surface 205 toward the housing surface 105. The coupling of the manifold 200 to the housing 100 may place the manifold inlet port 210 in communication with the housing inlet port 110. The communication between the manifold outlet port 220 and the housing outlet port 120 may be a fluidic communication (e.g., a fluid can flow through the manifold inlet port 110 and into the housing inlet port 110). The coupling of the manifold 200 to the housing 100 may place the manifold outlet port 220 in communication with the housing outlet port 120. The communication between the manifold outlet port 220 and the housing outlet port 120 may be a fluidic communication (e.g., a fluid can flow through the housing outlet port 120 and into the manifold outlet port 220). The coupling of the manifold 200 with the housing 100 may provide a fluid-tight seal at the interface between the manifold inlet port 210 and the housing inlet port 110. The coupling of the manifold 200 with the housing 100 may provide a fluid-tight seal at the interface between the manifold outlet port 220 and the housing outlet port 120.

The manifold 200 may couple the manifold inlet port 210 and manifold outlet port 220 together. The manifold 200 may be configured to allow for the manifold inlet port 210 to be brought into communication with the housing inlet port 110 simultaneously with the manifold outlet port 220 being brought into communication with the housing outlet port 120. Simultaneously establishing communication between the manifold inlet port 210 and the housing inlet port 110, and the manifold outlet port 220 and the housing inlet port 120 may simplify assembly of the first heat management system 250. Simplifying assembly of the first heat management system 250 may reduce the probability for fluid to leak at the interface of the manifold 200 and the housing 100. Leaking fluid may be an inconvenience or damage electronic devices (e.g., the semiconductor die 140).

The heat management system 250 may include a gasket material 230 configured to be disposed between the manifold 200 and the housing 100. The gasket material 230 may include an O-ring. The O-ring may include rubber, plastic, or metal. The gasket material 230 may be positioned at the interface of the housing surface 105 and the manifold surface 205. The gasket material 230 may project from the manifold surface 205, thereby causing the manifold surface 205 to be substantially planar. The gasket material 230 may improve the fluid-tight seal that is established at the interface between the manifold inlet port 210 and the housing inlet port 110. The gasket material 230 may improve the fluid-tight seal that is established at the interface between the manifold outlet port 220 and the housing outlet port 120.

The heat management system 250 may include a gasket recess 240. The gasket material 230 may be positioned within the gasket recess 240. The gasket material 230 may be partially contained within the gasket recess 240 while projecting from the manifold surface 205. The gasket recess 240 may be formed in the manifold 200, such as in the manifold surface 205. The gasket recess 240 may be formed in the housing 100, such as in the housing surface 105. The gasket recess 240 may surround the manifold inlet port 210. The gasket recess 240 may surround the manifold outlet port 220. The gasket recess 240 may surround the housing inlet port 110. The gasket recess 240 may surround the housing outlet port 120.

Figure 3:
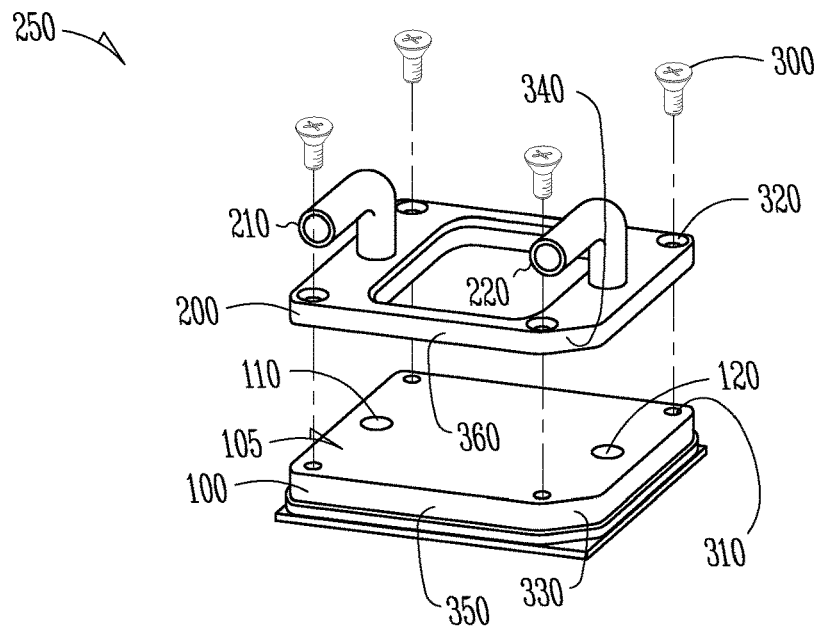
FIG. 3 illustrates another view of the first heat management system.

FIG. 3 illustrates another view of the first heat management system 250. The manifold 200 may be positioned proximate the housing 100. The manifold 200 may include manifold coupling features. The housing 100 may include housing coupling features. The housing coupling features may include a housing opening 310. The housing opening 310 may be extend into the housing surface 105. The housing opening 310 may be configured to receive, and couple with, a threaded fastener 300. The housing 100 may include a plurality of housing openings. The plurality of housing openings may include the housing opening 310.

The housing coupling features may include a housing notch 330. The housing notch 330 may be formed in a housing wall 350 of the housing 100, such as at a corner of the housing 100. In an example, the housing 100 may include three rounded corners and the housing notch 330.

The manifold coupling features may include a manifold opening 320. The manifold opening 320 may extend from the manifold surface 205 (not shown), through the manifold 200, to a top surface of the manifold 200. The manifold opening 320 may be configured to allow the threaded fastener 300 to pass through the manifold opening 320. The manifold opening 320 may be countersunk at the top surface of the manifold 200. The manifold 200 may include a plurality of manifold openings. The plurality of manifold openings may include the manifold opening 320.

The manifold coupling features may include a manifold notch 340. The manifold notch 340 may be formed in a manifold wall 360 of the manifold 200, such as at a corner of the manifold 200. In an example, the manifold 200 may include three rounded corners and the manifold notch 340. The manifold notch 340 may be configured to align with the housing notch 330.

The housing coupling features may be configured to correspond in arrangement to the manifold coupling features. The arrangement of the housing opening 310 may correspond in arrangement to the manifold opening 320. The housing opening 310 may be axially aligned with the manifold opening 310. The plurality of housing openings may be configured to correspond in arrangement to the plurality of manifold openings. The plurality of housing openings and the plurality of manifold openings may be arranged such that the manifold 200 may be coupled to the housing 100 in a single orientation, such as by asymmetrically configuring the arrangement of the plurality of housing openings and the plurality of manifold openings.

As described herein, the manifold 200 may be configured to couple with the housing 100 in a single orientation. The arrangement of the housing notch 330 may correspond in arrangement to the manifold notch 340. Arranging the housing notch 330 to correspond in arrangement to the manifold notch 340 may simplify assembly of, and the coupling of, the manifold 200 to the housing 100. Arranging the housing notch 330 to correspond in arrangement to the manifold notch 340 may prevent the incorrect assembly of the manifold and the housing 100, such as by providing a visual reference point indicating the correct alignment of the manifold 200 with respect to the housing 100.

The housing coupling features and the manifold coupling features may be configured to facilitate the coupling of the manifold 200 with the housing 100. The threaded fastener 300 may be translated through the manifold opening 320. The threaded fastener 300 may engage with threads formed in the housing opening 310. The engagement of the threaded fastener 300 with the housing opening 310 may facilitate the coupling of the manifold 200 with the housing 100, such as by providing a coupling force between the manifold 200 and the housing 100. The engagement of the threaded fastener 300 with the housing opening 310 may bias the manifold surface 205 (shown in FIG. 2) toward the housing surface 105. Other fasteners (e.g., non-threaded) may be used to couple the manifold 200 with the housing 100.

Figure 4:
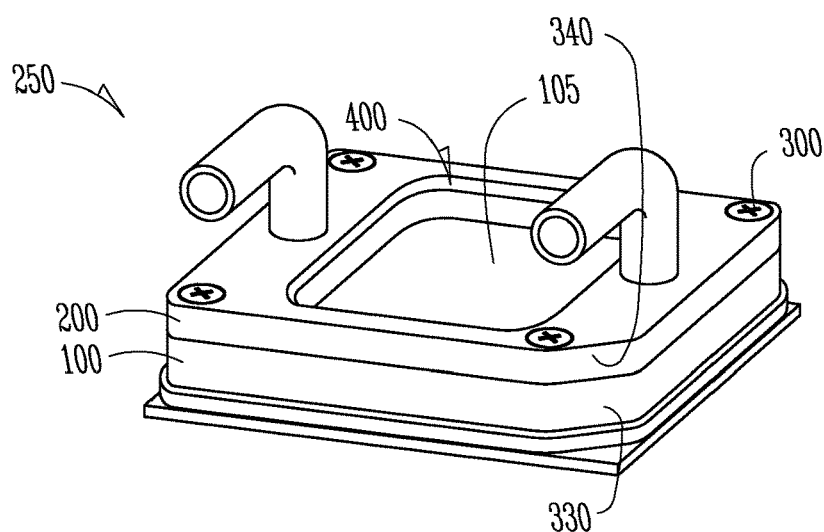
FIG. 4 illustrates yet another view of the first heat management system.

FIG. 4 illustrates yet another view of the first heat management system 250. In an example, the manifold 200 is coupled with the housing 100. The manifold surface 205 (shown in FIG. 2) is biased toward the housing surface 105. The manifold notch 340 is aligned with (e.g., directly adjacent to, or has coplanar surfaces with) the housing notch 330. The threaded fastener 300 is engaged with the housing 100 (e.g., the housing opening 310 of FIG. 3) and applies a coupling force to the manifold 200. The threaded fastener biases the manifold surface 205 toward the housing surface 105.

The manifold 200 may include a manifold aperture 400. The manifold aperture 400 may be a through hole (e.g., cutout) in the manifold 200. The manifold aperture 400 may allow for the reduction of material needed to manufacture the manifold 200. Reducing the materials needed to manufacture the manifold 200 may reduce overall manufacturing costs for the manifold 200.

Figure 5:
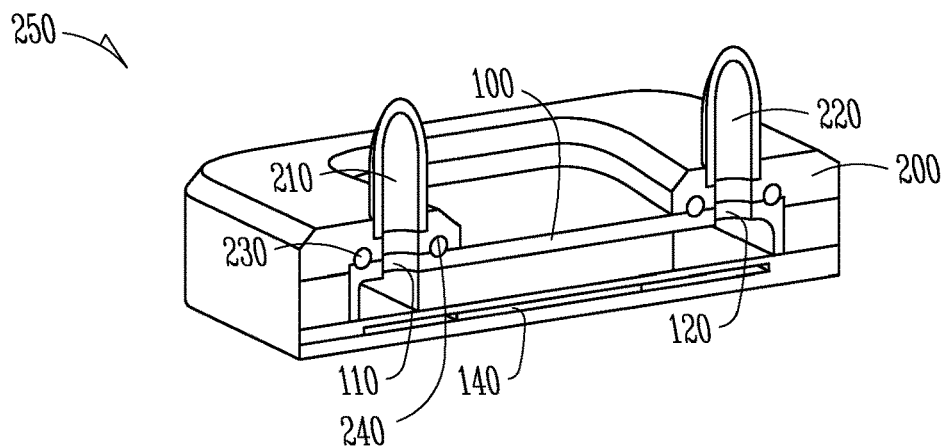
FIG. 5 illustrates a cross sectional view of the first heat management system.

FIG. 5 illustrates a cross sectional view of the first heat management system 250. As described herein, the manifold 200 may be coupled to the housing 100. In an example, the coupling of the manifold 200 to the housing 100 places the manifold inlet port 210 in communication with the housing inlet port 110 and places the manifold outlet port 220 in communication with the housing outlet port 120. The gasket recess 240 surrounds the manifold inlet port 210 and the manifold outlet port 220. The gasket material 230 is positioned within the gasket recess 240. The gasket material 230 is disposed between the manifold surface 205 (shown in FIG. 2) and the housing surface 105 (shown in FIGS. 1 and 3). The communication between the manifold inlet port 210 and the housing inlet port 110 is fluid-tight. The communication between the manifold outlet port 220 and the housing outlet port 120 is fluid-tight. Heat generated by the operation of the semiconductor die 140 flows to the housing 100 and the manifold 200.

Figure 6:
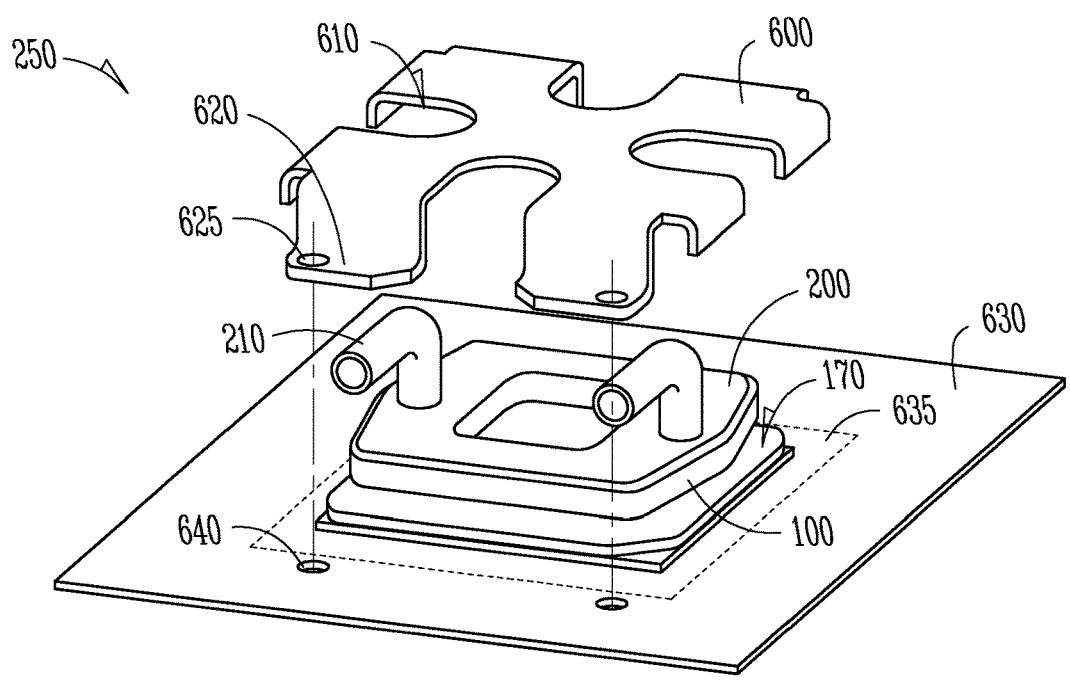
FIG. 6 illustrates an additional example of the first heat management system.

FIG. 6 illustrates an additional example of the first heat management system 250. The first heat management system 250 may include a retention bracket 600. The retention bracket 600 may be classified as a retention mechanism or a retainer. The retention bracket 600 may be configured to couple with manifold 200 and/or the housing 100. The retention bracket 600 may include a bracket aperture 610. The bracket aperture 610 may be configured to allow the retention bracket 600 to accommodate, and receive, the manifold 200, such as the manifold inlet port 210.

The retention bracket 600 may include retainer coupling features. The retention bracket 600 may include a bracket flange 620. The retainer coupling features may include the bracket flange 620. The retention bracket 600 may include a retainer through hole 625. The retainer coupling features may include the retainer through hole 625. The retainer through hole 625 may be included in the bracket flange 620. The retainer through hole 625 may extend through the retention bracket 600. The retainer coupling features (e.g., the retainer through hole 625) may be configured to couple the retention bracket 600 to additional structures, such as the housing coupling features. The first heat management system 250 may include a plurality of retainer coupling features. The plurality of retainer coupling features may include the retainer through hole 625.

Referring again to FIG. 6, the first heat management system 250 may include a motherboard 630. The motherboard 630 may include a socket 635. The socket 635 may be configured to interconnect with an electronic device, such as the package 170 or the substrate 160. The motherboard 630 may be configured to route electrical signals to and from the electronic device. The motherboard 630 may include motherboard coupling features. The motherboard coupling features may include a motherboard coupling feature 640. The motherboard coupling feature 640 may include an opening. The opening may be configured to receive, and engage with, a threaded fastener (e.g., the threaded fastener of FIG. 3). The motherboard coupling feature 640 may include a stud configured to engage with a threaded fastener (e.g., a nut).

The retainer through hole 625 may be configured to couple the retention bracket 600 to additional structures, such as the motherboard 630. The arrangement of the retainer coupling features may correspond to the arrangement of the motherboard coupling features. In one example, the arrangement of the retainer through hole 625 may correspond to the arrangement of (e.g., be aligned with) the motherboard coupling feature 640.

In an example, the package 170 is interconnected with the socket 635. The manifold 200 is coupled with the housing

100. The retention bracket 620 is coupled to the manifold 200. The threaded fastener 300 (shown in FIG. 3) is translated through the retainer through hole 625 and engaged with the motherboard coupling feature 640. The engagement of the threaded fastener 300 with the motherboard coupling feature 640 couples the manifold 200 to the housing 100 and the motherboard 630. The engagement of the threaded fastener 300 with the motherboard coupling feature 640 produces a coupling force between the manifold surface 205 (shown in FIG. 2) and the housing surface 105 (shown in FIG. 1). The engagement of the threaded fastener 300 with the motherboard coupling feature 640 biases the manifold surface 205 (shown in FIG. 2) toward the housing surface 105.

Figure 7:
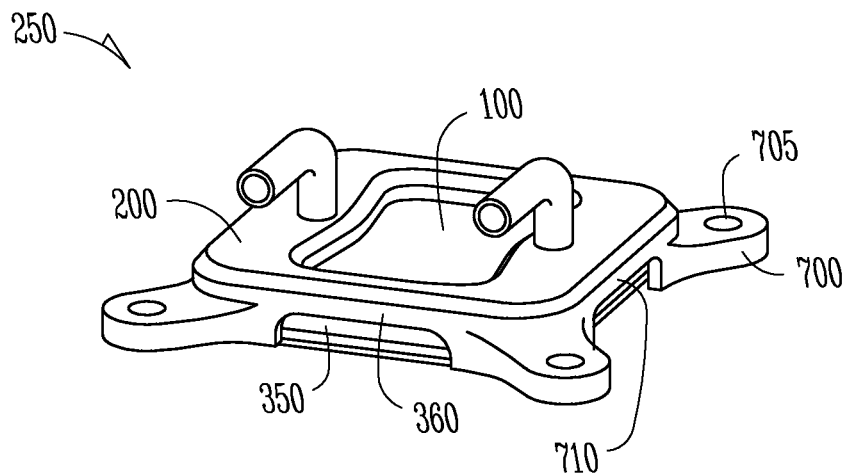
FIG. 7 illustrates a further example of the first heat management system.

FIG. 7 illustrates a further example of the first heat management system 250. The manifold 200 may include a foot 700. The manifold coupling features may include the foot 700. The foot 700 may protrude from the manifold 200, such as the manifold wall 360 of the manifold 200. The foot 700 may include an opening 705. The opening 705 may be configured to receive the threaded fastener (shown in FIG. 3). The manifold 200 may include a plurality of feet. The plurality of feet may include the foot 700. The foot 700 may be configured to couple the manifold 200 with additional structures, such as the housing 100 or the motherboard 630 (e.g., the motherboard coupling feature 640 shown in FIG. 6).

The manifold 200 may be configured to receive a portion of the housing 100. The manifold 200 may include a manifold lip 710. The manifold wall 360 may be configured to include the manifold lip 710. The manifold lip 710 may engage with (e.g., surface-to-surface contact) the housing wall 350. The manifold lip 710 may extend to a bottom of the housing 100. The manifold lip 710 may enclose a portion of the housing 100 within the manifold 200.

Figure 8:
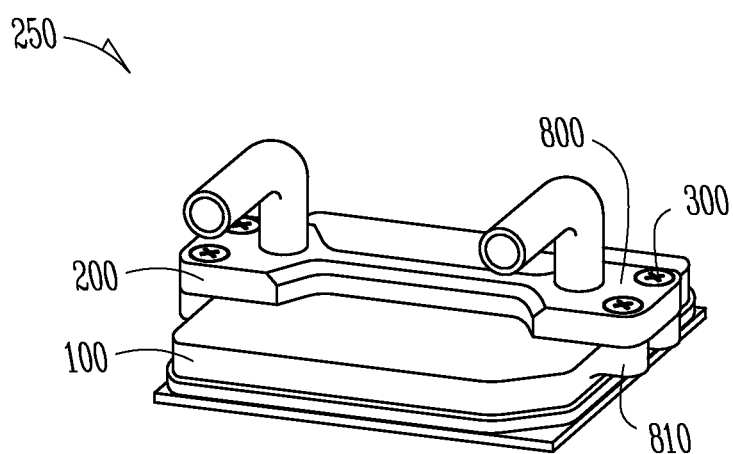
FIG. 8 illustrates another example of the first heat management system.

FIG. 8 illustrates another example of the first heat management system 250. The manifold 200 may include a manifold flange 800. The manifold coupling features may include the manifold flange 800. The manifold flange 800 may extend from the manifold 200. The manifold flange 800 may include an opening. The opening may be configured to receive the threaded fastener 300.

The housing 100 may include a housing flange 810. The housing coupling features may include the housing flange 810. The housing flange 810 may extend from the housing 100. The housing flange may include an opening. The opening in the housing flange 810 may be arranged to correspond with the arrangement of the opening in the manifold flange 800. The opening may be configured to receive, and engage with, the threaded fastener 300. The housing flange 810 may include a stud. The stud may project from the housing flange 810 and translate through the opening in the manifold flange 800.

Figure 9:
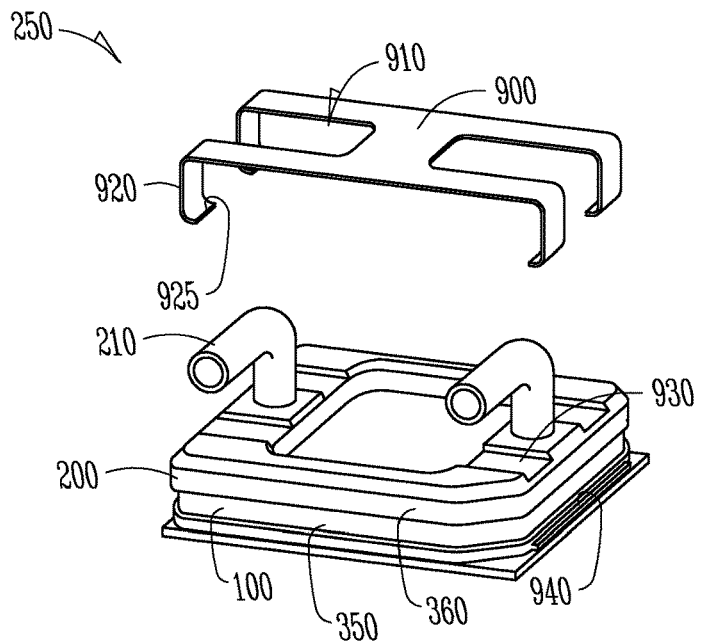
FIG. 9 illustrates yet another example of the first heat management system.

FIG. 9 illustrates yet another example of the first heat management system 250. The first heat management system 250 may include a retention clip 900. The retention clip may include a resilient (e.g., spring-like) material. The retention clip 900 may be classified as a retention mechanism or a retainer. The retention clip 910 may include a clip aperture 910. The clip aperture 910 may be configured to allow the retention clip 900 to accommodate, and receive, the manifold 200, such as the manifold inlet port 210.

The retention clip 900 may include retainer coupling features. The retention clip 900 may include a hook portion 920. The retainer coupling features may include the hook portion 920. The hook portion 920 may extend from the retention clip 900. The hook portion 920 may include a projection 925 that extends toward the housing wall 350. The retainer coupling features may include the projection 925. The hook portion 920 may be configured to deflect when engaged with the manifold 200 and/or the housing 100. The hook portion 920 may be configured to be biased toward the manifold 200 and/or the housing 100, such as by utilizing the resilient material.

The manifold 200 may include a retainer well 930. The manifold coupling features may include the retainer well 930. The retainer well 930 may be configured to accommodate the retention clip 930. The retainer well 930 may simplify the assembly of the first heat management system 250, such as by ensuring the retention clip 900 is seated in the intended position and orientation with respect to the manifold 200 and the housing 100. The retainer well 930 may be configured to align the manifold 200 (e.g., the manifold inlet port 210) with respect to the housing 100 (e.g., the housing inlet port 110 shown in FIG. 1). The manifold 200 may include a plurality of retainer wells. The plurality of retainer wells may include the retainer well 930.

The housing 100 may include a housing groove 940. The housing coupling features may include the housing groove 940. The housing groove 940 may be formed in the housing wall 350. The housing groove 940 may project from the housing wall 350. The housing groove 340 may correspond in arrangement to the retention clip 300, such as the hook portion 920.

The projection 925 may be configured to engage with the housing groove 340. The retention clip 900 may be configured to be positioned within the retainer well 930 when the projection 925 is engaged with the housing groove 340. The engagement of the projection 925 with the housing groove 340 may facilitate the coupling of the retaining clip 900 to the housing 100. The manifold 200 may be configured to be positioned between the retention clip 900 and the housing 100. The engagement of the projection 925 with the housing groove 340 may facilitate the coupling of the manifold 200 to the housing 100. The engagement of the projection 925 with the housing groove 340 may bias the manifold surface 205 (shown in FIG. 2) toward the housing surface 105.

Figure 10:
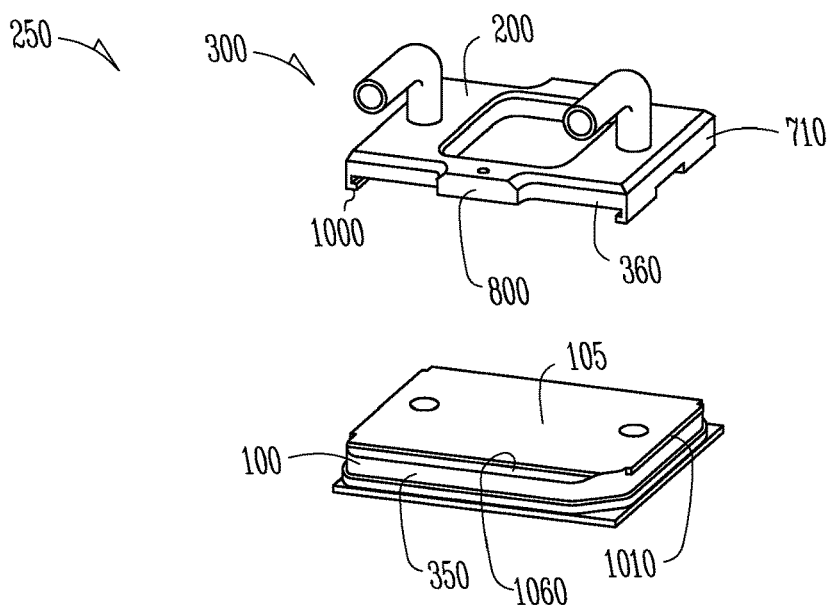
FIG. 10 illustrates still yet another example of the first heat management system.

FIG. 10 illustrates still yet another example of the first heat management system 250. As described herein, the manifold 200 may include manifold coupling features and the housing 100 may include housing coupling features. The manifold 200 may include a manifold groove 1000. The manifold coupling features may include the manifold groove 1000. The manifold groove 1000 may be formed in the manifold lip 710. The manifold groove 1000 may extend along a length of the manifold 200.

The housing 100 may include a rail 1010. The housing coupling features may include the rail 1010. The arrangement of the manifold groove 1000 may correspond to the arrangement of the rail 1010. The rail 1010 may be configured to engage with the manifold groove 1000. The rail 1010 may be configured to intermesh with the manifold groove 1000. The manifold groove 1000 may be configured to receive the rail 1010 in a slidable coupling of the manifold 200 and the housing 100. The slidable coupling of the manifold 200 with the housing 100 may align the manifold 200 with respect to the housing 100. The slidable coupling of the manifold 200 with the housing 100 may allow for the manifold 200 to translate with respect to the housing 100. The slidable coupling of the manifold 200 with the housing 100 may produce a coupling force between the manifold 200 and the housing 100. The slidable coupling of the manifold 200 with the housing 100 may bias the manifold surface 205 (shown in FIG. 2) toward the housing surface 105.

The manifold coupling features and the housing coupling features may be configured to allow the manifold 200 to lock into position with respect to the housing 100. The manifold coupling features and the housing coupling features may be configured such that when the manifold 200 is aligned with the housing 100, a first force is necessary to translate the manifold 200 with respect to the housing 100. The manifold coupling features and the housing coupling features may be configured such that when the manifold 200 is not aligned with the housing 100 a second force is necessary to translate the manifold 200 with respect to the housing 100. The manifold coupling features and housing coupling features may be configured such that the first force is greater than the second force, such as by configuring the rail 1010 to seat, or snap into position, within the manifold groove 1000 when the manifold 200 is aligned with the housing 100.

The housing 100 may include a housing recess 1060. The housing recess 1060 may be formed in the housing wall 350. A height of the housing recess 1060 may be less than a height of the housing surface 105. The manifold 200 may include the manifold flange 800. The manifold flange 800 may extend above the housing recess 1060 when the manifold 200 is aligned with the housing 100. The manifold flange 800 may be configured to receive the threaded fastener 300. The threaded fastener 300 may be threaded into an opening in the manifold flange 800. The manifold flange 800 may position the threaded fastener such that the threaded fastener 300 may engage with the housing recess 1060. Engagement of the threaded fastener 300 may fix the position (e.g., prevent the sliding translation) of the manifold 200 with respect to the housing 100. The threaded fastener 300 may engage the housing recess 1060 only when the manifold 200 is aligned with respect to the housing 100.

The manifold coupling features, housing coupling features, retainer coupling feature, and motherboard coupling features described herein may be interchangeable with each other. For instance, the housing 100 may include the manifold coupling features while the manifold 200 includes the corresponding housing coupling features. The manifold coupling features, housing coupling features, retainer coupling features, and the motherboard coupling features may be combined in various permutations to achieve the coupling of the manifold 200 with the housing 100.

Figure 11:
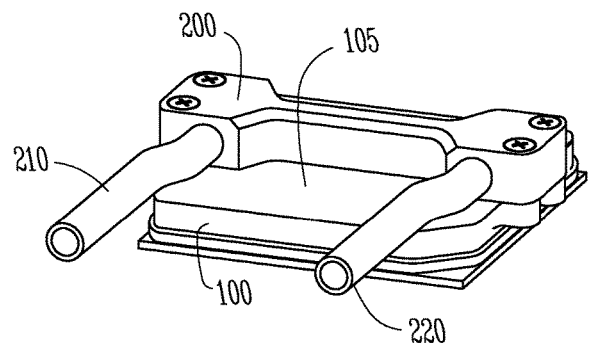
FIG. 11 illustrates a still yet further example of the first heat management system.

FIG. 11 illustrates a still yet further example of the first heat management system 250. The manifold inlet port 210 may extend from the manifold 200 in a direction perpendicular to the manifold surface 205. The manifold inlet port 210 may extend from the manifold 200 in a direction parallel to the manifold surface 205. The manifold inlet port 210 may extend from the manifold 200 at an angle with respect to the manifold surface 205.

The manifold outlet port 220 may extend from the manifold 200 in a direction perpendicular to the manifold surface 205. The manifold outlet port 220 may extend from the manifold 200 in a direction parallel to the manifold surface 205. The manifold outlet port 220 may extend from the manifold 200 at an angle with respect to the manifold surface 205.

In an example, the manifold inlet port 210 and the manifold outlet port 220 are configured to extend from the manifold 200 substantially parallel to the manifold surface 205 (e.g., as shown in FIG. 11). The configuring of the manifold inlet port 210 and the manifold outlet port 220 to extend substantially parallel to the manifold surface 205 may allow for a reduction in the overall height of the manifold 200 and the first heat management system 250. Reducing the overall height of the manifold 200 and the first heat management system 250 may allow for a smaller electronic device that incorporates the manifold 200 or the first heat management system 250.

Figure 12:
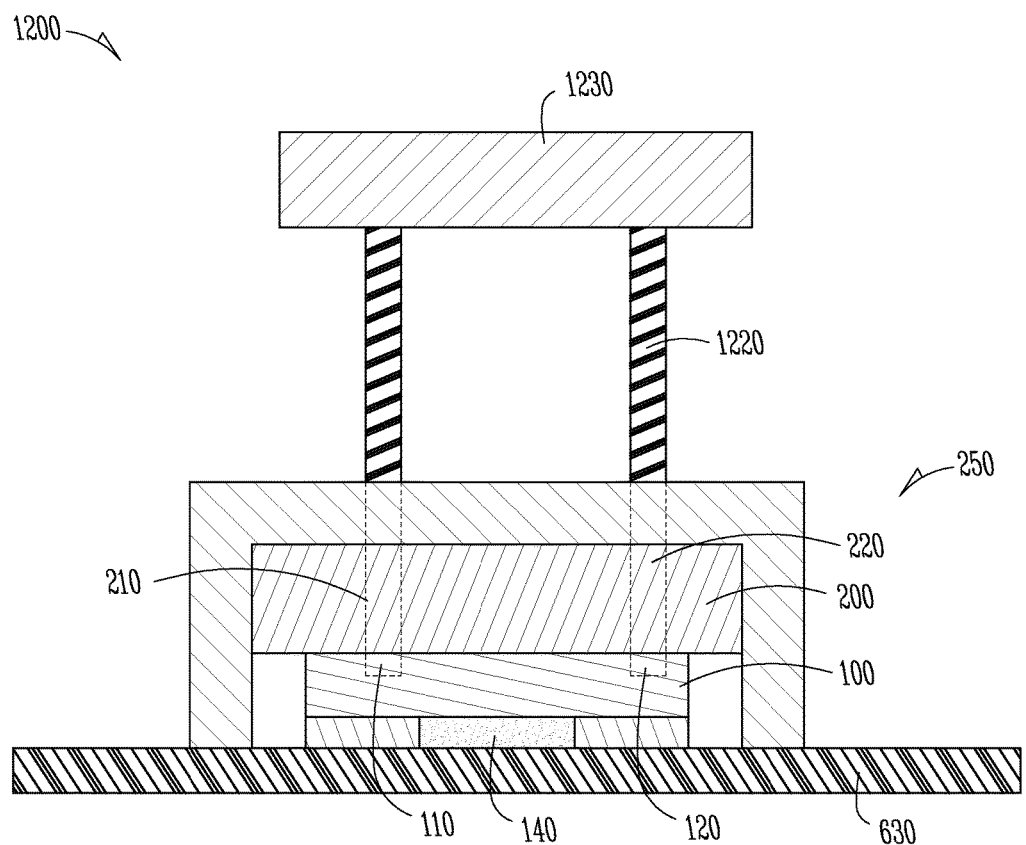
FIG. 12 illustrates a schematic view of an example of a second heat management system.

FIG. 12 illustrates a schematic view of an example of a second heat management system 1200. The second heat management system 1200 may include the first heat management system 250. The second heat management system 1200 may include a clamp 1210. The clamp 1210 may be a retention mechanism. The clamp 1110 may be configured to couple with the motherboard 630.

The second heat management system 1200 may include a fluid line 1220 (e.g., tubing made of plastic, rubber, composite materials, metal, or the like). The second heat management system 1200 may include a fluid line 1220. The fluid line 1220 may be configured to couple with the manifold inlet port 210. The fluid line 1220 may be configured to couple with the manifold outlet port 220.

The second heat management system 1200 may include a heat exchanger 1230. The fluid line 1220 may be configured to couple with the heat exchanger 1230. The fluid line 1220 may establish communication between the manifold 200 (e.g., the manifold inlet port 210 and the manifold outlet port 220) and the heat exchange 1230.

As described herein the semiconductor die 140 may produce heat during operation. The heat may flow into the housing 100. Fluid (e.g., a working fluid) may flow through the fluid line 1220 and enter the manifold inlet 210. The fluid may flow through the manifold inlet 210 into the housing inlet port 110. The fluid may flow through the housing inlet port 110, through the housing 100, and into the housing outlet port 120.

As the fluid flows through the housing 100, the heat produced by the semiconductor die 140 is transferred into the fluid. The heated fluid then may flow out of the housing outlet port 120 and into the manifold outlet port 220. The heated fluid may flow from the manifold outlet 210, through the fluid line 1220, and into the heat exchanger 1230. The heated fluid may flow through the heat exchanger 1230 and the heat exchanger may dissipate the thermal energy of the fluid into the surrounding environment. The cooled fluid may exit the heat exchanger and return to the fluid line 1220 and the manifold inlet 210.

Figure 13:
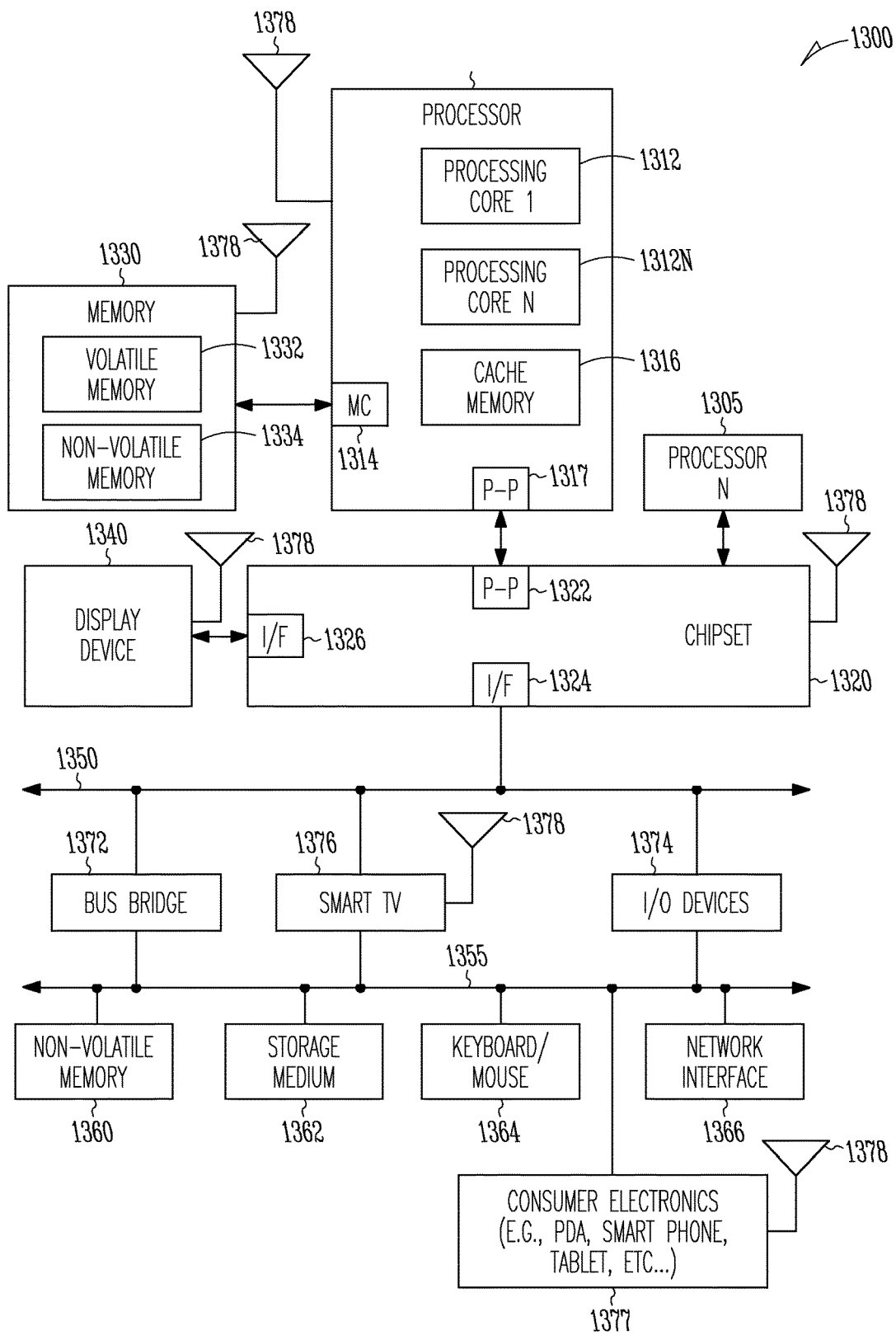
FIG. 13 illustrates a system level diagram, depicting an example of an electronic device including the first heat management system or the second heat management system as described in the present disclosure.

FIG. 13 illustrates a system level diagram, depicting an example of an electronic device (e.g., system 1300) including the first heat management system 250 or the second heat management system 1200 as described in the present disclosure. FIG. 13 is included to show an example of a higher level device application for the first heat management system 250 or the second heat management system 1200. In one embodiment, system 1300 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 1300 is a system on a chip (SOC) system.

In one embodiment, processor 1310 has one or more processor cores 1312 and 1312N, where 1312N represents the Nth processor core inside processor 1310 where N is a positive integer. In one embodiment, system 1300 includes multiple processors including 1310 and 1305, where processor 1305 has logic similar or identical to the logic of processor 1310. In some embodiments, processing core 1312 includes, but is not limited to, pre-fetch logic to fetch instructions, decode logic to decode the instructions, execution logic to execute instructions and the like. In some embodiments, processor 1310 has a cache memory 1316 to cache instructions and/or data for system 1300. Cache memory 1316 may be organized into a hierarchal structure including one or more levels of cache memory.

In some embodiments, processor 1310 includes a memory controller 1314, which is operable to perform functions that enable the processor 1310 to access and communicate with memory 1330 that includes a volatile memory 1332 and/or a non-volatile memory 1334. In some embodiments, processor 1310 is coupled with memory 1330 and chipset 1320. Processor 1310 may also be coupled to a wireless antenna 1378 to communicate with any device configured to transmit and/or receive wireless signals. In one embodiment, an interface for wireless antenna 1378 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 1332 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 1334 includes, but is not limited to, flash memory, phase change memory (PCM), read-only memory (ROM), electrically erasable programmable read-only memory (EEPROM), or any other type of non-volatile memory device.

Memory 1330 stores information and instructions to be executed by processor 1310. In one embodiment, memory 1330 may also store temporary variables or other intermediate information while processor 1310 is executing instructions. In the illustrated embodiment, chipset 1320 connects with processor 1310 via Point-to-Point (PtP or P-P) interfaces 1317 and 1322. Chipset 1320 enables processor 1310 to connect to other elements in system 1300. In some embodiments of the example system, interfaces 1317 and 1322 operate in accordance with a PtP communication protocol such as the Intel® QuickPath Interconnect (QPI) or the like. In other embodiments, a different interconnect may be used.

In some embodiments, chipset 1320 is operable to communicate with processor 1310, 1305N, display device 1340, and other devices, including a bus bridge 1372, a smart TV 1376, I/O devices 1374, nonvolatile memory 1360, a storage medium (such as one or more mass storage devices) 1362, a keyboard/mouse 1364, a network interface 1366, and various forms of consumer electronics 1377 (such as a PDA, smart phone, tablet etc.), etc. In one embodiment, chipset 1320 couples with these devices through an interface 1324. Chipset 1320 may also be coupled to a wireless antenna 1378 to communicate with any device configured to transmit and/or receive wireless signals.

Chipset 1320 connects to display device 1340 via interface 1326. Display 1340 may be, for example, a liquid crystal display (LCD), a plasma display, cathode ray tube (CRT) display, or any other form of visual display device. In some embodiments of the example system, processor 1310 and chipset 1320 are merged into a single SOC. In addition, chipset 1320 connects to one or more buses 1350 and 1355 that interconnect various system elements, such as I/O devices 1374, nonvolatile memory 1360, storage medium 1362, a keyboard/mouse 1364, and network interface 1366. Buses 1350 and 1355 may be interconnected together via a bus bridge 1372.

In one embodiment, mass storage device 1362 includes, but is not limited to, a solid state drive, a hard disk drive, a universal serial bus flash memory drive, or any other form of computer data storage medium. In one embodiment, network interface 1366 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 13 are depicted as separate blocks within the system 1300, the functions performed by some of these blocks may be integrated within a single semiconductor circuit or may be implemented using two or more separate integrated circuits. For example, although cache memory 1316 is depicted as a separate block within processor 1310, cache memory 1316 (or selected aspects of 1316) can be incorporated into processor core 1312.

FIG. 14 illustrates one example of a method 1400 for assembling an electronic system, including the heat management system 250 described herein. In describing the method 1400, reference is made to one or more components, features, functions and steps previously described herein. Where convenient, reference is made to the components, features, steps and the like with reference numerals. The reference numerals provided are exemplary and are not exclusive. For instance, components, features, functions, steps and the like described in the method 1400 include, but are not limited to, the corresponding numbered elements provided herein and other corresponding elements described herein (both numbered and unnumbered) as well as their equivalents.

At operation 1410, a first manifold may be placed proximate a first housing. The first manifold may include manifold coupling features. The first housing may include housing coupling features. The housing coupling features may correspond in arrangement to the manifold coupling features.

At operation 1420, the manifold coupling features may be aligned with the housing coupling features. Aligning the manifold coupling features with the housing coupling features may position the manifold in the correct position and orientation with respect to the housing. At operation 1430, the first manifold may be coupled with the first housing. The coupling of the first manifold with the first housing may bias a manifold surface toward a housing surface.

Several options for the method 1400 follow. In some instances, aligning the manifold coupling features with the housing coupling features may include aligning an asymmetrically configured housing coupling feature with a corresponding asymmetrically configured housing coupling feature. In an example, the coupling of the first manifold with the first housing may place the manifold inlet port in communication with the housing inlet port, and simultaneously places the manifold outlet port in communication with the housing outlet port.

In another example, the first manifold may be decoupled from the first housing and the first manifold may be coupled with a second housing. In yet another example, the first manifold may be decoupled from the first housing and a second manifold may be coupled with the first housing. In a further example, threaded fasteners may be coupled to the manifold coupling features and the housing coupling features. In some instances, a retention mechanism may be placed proximate the manifold. The retention mechanism and manifold assembly may be coupled to the housing. The retention mechanism may be coupled with the first manifold and the first housing. The retention mechanism may be coupled with a motherboard.

Various Notes

Aspect 1 may include or use subject matter (such as an apparatus, a system, a device, a method, a means for performing acts, or a device readable medium including instructions that, when performed by the device, may cause the device to perform acts), such as may include or use a heat management system. The heat management system may include a die package. The die package may include a housing. The housing may include a housing surface. The housing may include a housing inlet port. The housing inlet port may be in communication with the housing surface. The housing may include a housing outlet port. The housing outlet port may be in communication with the housing surface.

The heat management system may include a manifold. The manifold may be configured to couple with the housing. The manifold may include a manifold surface. The manifold surface may be configured to mate with the housing surface. The manifold may include a manifold inlet port. The manifold inlet port may be in communication with the manifold surface. The manifold may include a manifold outlet port. The manifold outlet port may be in communication with the manifold surface.

Aspect 2 may include or use, or may optionally be combined with the subject matter of Aspect 1, to optionally include or use that the manifold surface may be in direct surface-to-surface contact with the housing surface. The manifold inlet port may be in communication with the housing inlet port. The manifold outlet port may be in communication with the housing outlet port.

Aspect 3 may include or use, or may optionally be combined with the subject matter of one or any combination of Aspects 1 or 2 to optionally include or use that the manifold may be configured to allow for the manifold inlet port to be brought into communication with the housing inlet port simultaneously with the manifold outlet port being brought into communication with the housing outlet port.

Aspect 4 may include or use, or may optionally be combined with the subject matter of one or any combination of Aspects 1 through 3 to optionally include or use a gasket material. The gasket material may be configured to be disposed between the manifold and the housing.

Aspect 5 may include or use, or may optionally be combined with the subject matter of Aspect 4 to optionally include or use a first gasket recess. The first gasket recess may surround the manifold inlet port. The heat management system may include a second gasket recess. The second gasket recess may surround the manifold outlet port. The gasket material may be positioned within the first gasket recess and the second gasket recess.

Aspect 6 may include or use, or may optionally be combined with the subject matter of one or any combination of Aspects 1 through 5 to optionally include or use that the housing surface is a planar surface.

Aspect 7 may include or use, or may optionally be combined with the subject matter of one or any combination of Aspects 1 through 6 to optionally include or use that an aperture in the manifold.

Aspect 8 may include or use, or may optionally be combined with the subject matter of one or any combination of Aspects 1 through 7 to optionally include or use a manifold lip. The manifold lip may be configured to engage with a housing wall.

Aspect 9 may include or use, or may optionally be combined with the subject matter of one or any combination of Aspects 1 through 8 to optionally include or use that the manifold and the housing may be configured to allow the manifold to couple with the housing in a single orientation.

Aspect 10 may include or use, or may optionally be combined with the subject matter of one or any combination of Aspects 1 through 9 to optionally include or use that the housing may include a plurality of channels. The plurality of channels may be configured to alter the flow of a fluid within the housing. The plurality of channels may be in communication with the housing inlet port and the housing outlet port.

Aspect 11 may include or use, or may optionally be combined with the subject matter of one or any combination of Aspects 1 through 10 to optionally include or use that the manifold may include manifold coupling features. The housing may include housing coupling features. The housing coupling features may be configured to correspond in arrangement to the manifold coupling features. The manifold coupling features and the housing coupling features may be configured to facilitate the coupling of the manifold with the housing.

Aspect 12 may include or use, or may optionally be combined with the subject matter of Aspect 11 to optionally include or use that the manifold coupling features and the housing coupling features may be configured to receive threaded fasteners.

Aspect 13 may include or use, or may optionally be combined with the subject matter of one or any combination of Aspects 11 or 12 to optionally include or use that the manifold coupling features may include either a rail or groove. The housing coupling features may include the other of the rail or the groove. The rail and groove may be configured to intermesh with each other to provide a coupling force between the manifold and the housing.

Aspect 14 may include or use, or may optionally be combined with the subject matter of one or any combination of Aspects 1 through 13 to optionally include or use a retention mechanism. The manifold may be configured to be positioned between the retention mechanism and the housing. The retention mechanism may include retainer coupling features. The housing may include housing coupling features. The housing coupling features may correspond in arrangement to the retainer coupling features. The retainer coupling features and the housing coupling features may be configured to facilitate the coupling of the retention mechanism with the housing. The coupling of the retention mechanism with the housing may couple the manifold with the housing.

Aspect 15 may include or use subject matter (such as an apparatus, a system, a device, a method, a means for performing acts, or a device readable medium including instructions that, when performed by the device, may cause the device to perform acts), such as may include or use a heat management system. The heat management system may include a die package. The die package may include a housing. The housing may include a housing surface. The housing may include a housing inlet port. The housing inlet port may be in communication with the housing surface. The housing may include a housing outlet port. The housing outlet port may be in communication with the housing surface.

The heat management system may include a manifold. The manifold may be configured to couple with the housing. The manifold may include a manifold surface. The manifold surface may be configured to mate with the housing surface. The manifold may include a manifold inlet port. The manifold inlet port may be in communication with the manifold surface. The manifold may include a manifold outlet port. The manifold outlet port may be in communication with the manifold surface The heat management system may include a heat exchanger. The heat exchanger may be configured to dissipate heat. The heat management system may include one or more fluid transport lines. The fluid transport lines may be configured to establish communication between the manifold inlet port and the heat exchanger. The fluid transport lines may be configured to establish communication between the manifold outlet port and the heat exchanger.

Aspect 16 may include or use, or may optionally be combined with the subject matter of Aspect 15, to optionally include or use a semiconductor die. The semiconductor die may be coupled to the housing.

Aspect 17 may include or use, or may optionally be combined with the subject matter of one or any combination of Aspects 15 or 16 to optionally include or use a motherboard. The motherboard may be configured to be in communication with the semiconductor die.

Aspect 18 may include or use, or may optionally be combined with the subject matter of Aspect 17 to optionally include or use that the manifold may include manifold coupling features. The motherboard may include motherboard coupling features. The motherboard coupling features may correspond in arrangement to the manifold coupling features. The manifold coupling features and the motherboard coupling features may be configured to facilitate the coupling of the manifold with the housing.

Aspect 19 may include or use, or may optionally be combined with the subject matter of one or any combination of Aspects 17 or 18 to optionally include or use a retention mechanism. The manifold may be configured to be positioned between the retention mechanism and the motherboard. The retention mechanism may include retainer coupling features. The motherboard may include motherboard coupling features. The motherboard coupling features may correspond in arrangement to the retainer coupling features. The retainer coupling features and the motherboard coupling features may be configured to facilitate the coupling of the retention mechanism with the motherboard. The coupling of the retention mechanism with the motherboard may couple the manifold with the housing.

Aspect 20 may include or use, or may optionally be combined with the subject matter of one or any combination of Aspects 15 through 19 to optionally include or use that the manifold surface may be in direct surface-to-surface contact with the housing surface, The manifold inlet port may be in communication with the housing inlet port. The manifold outlet port may be in communication with the housing outlet port.

Aspect 21 may include or use, or may optionally be combined with the subject matter of one or any combination of Aspects 15 through 20 to optionally include or use that the manifold may be configured to allow for the manifold inlet port to be brought into communication with the housing inlet port simultaneously with the manifold outlet port being brought into communication with the housing outlet port.

Aspect 22 may include or use subject matter (such as an apparatus, a system, a device, a method, a means for performing acts, or a device readable medium including instructions that, when performed by the device, may cause the device to perform acts), such as may include or use a method for assembling an electronic system. The method may include placing a first manifold proximate a first housing. The manifold may include manifold coupling features. The housing may include housing coupling features. The housing coupling features may correspond in arrangement to the manifold coupling features. The method may include aligning the first manifold coupling features with the housing coupling features. The method may include coupling the first manifold with the first housing.

Aspect 23 may include or use, or may optionally be combined with the subject matter of Aspect 22, to optionally include or use that coupling the first manifold with the first housing may place the manifold inlet port in communication with the housing inlet port. Coupling the first manifold with the first housing may simultaneously places the manifold outlet port in communication with the housing outlet port.

Aspect 24 may include or use, or may optionally be combined with the subject matter of one or any combination of Aspects 22 or 23 to optionally include or use that the method includes decoupling the first manifold from the first housing and coupling the first manifold with a second housing.

Aspect 25 may include or use, or may optionally be combined with the subject matter of one or any combination of Aspects 22 through 24 to optionally include or use that the method includes decoupling the first manifold from the first housing. The method may include coupling a second manifold with the first housing.

Aspect 26 may include or use, or may optionally be combined with the subject matter of one or any combination of Aspects 22 through 25 to optionally include or use that aligning the manifold coupling features with the housing coupling features may include aligning an asymmetrically configured housing coupling feature with a corresponding asymmetrically configured housing coupling feature.

Aspect 27 may include or use, or may optionally be combined with the subject matter of one or any combination of Aspects 22 through 26 to optionally include or use that the method may include coupling threaded fasteners to the manifold coupling features and the housing coupling features.

Aspect 28 may include or use, or may optionally be combined with the subject matter of one or any combination of Aspects 22 through 27 to optionally include or use that the method may include placing a retention mechanism proximate the manifold. The method may include coupling the retention mechanism with the first manifold and the first housing.

Aspect 29 may include or use, or may optionally be combined with the subject matter of one or any combination of Aspects 22 through 28 to optionally include or use that the method may include placing a retention mechanism proximate the manifold. The method may include coupling the retention mechanism with a motherboard.

Each of these non-limiting examples may stand on its own, or may be combined in various permutations or combinations with one or more of the other examples.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A heat management system, comprising:
   a die package including a housing, wherein the housing includes:
   a housing surface,
   a housing inlet port in communication with the housing surface, wherein the housing inlet port is configured to allow a fluid to flow within the housing inlet port,
   a housing outlet port in communication with the housing surface, wherein:
   the housing outlet port is configured to allow a fluid to flow within the housing outlet port, and the housing outlet port is in fluidic communication with the housing inlet port; and
   a manifold configured to couple with the housing, the manifold including:
   a manifold surface configured to mate with the housing surface, a manifold inlet port in communication with the manifold surface, wherein the manifold inlet port is configured to allow a fluid to flow within the manifold inlet port, and
   a manifold outlet port in communication with the manifold surface, wherein the manifold outlet port is configured to allow a fluid to flow within the manifold outlet port.

2. The heat management system of claim 1, wherein the manifold surface is in direct surface-to-surface contact with the housing surface, the manifold inlet port is in communication with the housing inlet port, and the manifold outlet port is in communication with the housing outlet port.

3. The heat management system of claim 1, wherein the manifold is configured to allow for the manifold inlet port to be brought into communication with the housing inlet port simultaneously with the manifold outlet port being brought into communication with the housing outlet port.

4. The heat management system of claim 1, further comprising a gasket material configured to be disposed between the manifold and the housing.

5. The heat management system of claim 4, further comprising a first gasket recess surrounding the manifold inlet port and a second gasket recess surrounding the manifold outlet port, and wherein the gasket material is positioned within the first gasket recess and the second gasket recess.

6. The heat management system of claim 1, wherein the housing surface is a planar surface.

7. The heat management system of claim 1, further comprising a manifold lip configured to engage with a housing wall.

8. The heat management system of claim 1, wherein the manifold and the housing are configured to allow the manifold to couple with the housing in a single orientation.

9. The heat management system of claim 1, wherein the housing includes a plurality of channels configured to alter the flow of a fluid within the housing, and the plurality of channels are in communication with the housing inlet port and the housing outlet port.

10. The heat management system of claim 1, wherein:
the manifold includes manifold coupling features,
the housing includes housing coupling features configured to correspond in arrangement to the manifold coupling features, and
the manifold coupling features and the housing coupling features are configured to facilitate the coupling of the manifold with the housing.

11. The heat management system of claim 10, wherein:
the manifold coupling features include either a rail or groove,
the housing coupling features include the other of the rail or the groove, and
the rail and groove are configured to intermesh with each other to provide a coupling force between the manifold and the housing.

12. The heat management system of claim 1, further comprising a retention mechanism, wherein:
the manifold is configured to be positioned between a retention mechanism and the housing,
the retention mechanism includes retainer coupling features,
the housing includes housing coupling features corresponding in arrangement to the retainer coupling features, and
the retainer coupling features and the housing coupling features are configured to facilitate the coupling of the retention mechanism with the housing, thereby coupling the manifold with the housing.

13. A heat management system, comprising:
a die package including a housing, wherein the housing includes:
a housing surface,
a housing inlet port in communication with the housing surface,
a housing outlet port in communication with the housing surface;
a manifold configured to couple with the housing, the manifold including:
a manifold surface configured to mate with the housing surface,
a manifold inlet port in communication with the manifold surface, and
a manifold outlet port in communication with the manifold surface;
a heat exchanger configured to dissipate heat; and
one or more fluid transport lines configured to establish communication between the manifold inlet port and the heat exchanger, and to establish communication between the manifold outlet port and the heat exchanger.

14. The heat management system of claim 13, further comprising a semiconductor die coupled to the housing.

15. The heat management system of claim 13, further comprising a motherboard configured to be in communication with a semiconductor die.

16. The heat management system of claim 15, wherein:
the manifold includes manifold coupling features,
the motherboard includes motherboard coupling features corresponding in arrangement to the manifold coupling features, and
the manifold coupling features and the motherboard coupling features are configured to facilitate the coupling of the manifold with the housing.

17. The heat management system of claim 15, further comprising a retention mechanism, wherein:
the manifold is configured to be positioned between the retention mechanism and the motherboard,
the retention mechanism includes retainer coupling features,
the motherboard includes motherboard coupling features corresponding in arrangement to the retainer coupling features, and
the retainer coupling features and the motherboard coupling features are configured to facilitate the coupling of the retention mechanism with the motherboard, thereby coupling the manifold with the housing.

18. The heat management system of claim 13, wherein the manifold surface is in direct surface-to-surface contact with the housing surface, the manifold inlet port is in communication with the housing inlet port, and the manifold outlet port is in communication with the housing outlet port.

19. The heat management system of claim 13, wherein the manifold is configured to allow for the manifold inlet port to be brought into communication with the housing inlet port simultaneously with the manifold outlet port being brought into communication with the housing outlet port.

20. A method for assembling an electronic system, comprising:
placing a first manifold including manifold coupling features proximate a first housing, the housing including housing coupling features corresponding in arrangement to the manifold coupling features;
aligning the first manifold coupling features with the housing coupling features;
coupling the first manifold with the first housing;
wherein the first manifold includes:
a manifold surface configured to mate with the housing surface,
a manifold inlet port in communication with the manifold surface, wherein the manifold inlet port is configured to allow a fluid to flow within the manifold inlet port, and
a manifold outlet port in communication with the manifold surface, wherein the manifold outlet port is configured to allow a fluid to flow within the manifold outlet port; and
wherein the housing includes:
a housing surface,
a housing inlet port in communication with the housing surface, wherein the housing inlet port is configured to allow a fluid to flow within the housing inlet port,
a housing outlet port in communication with the housing surface, wherein:
the housing outlet port is configured to allow a fluid to flow within the housing outlet port, and
the housing outlet port is in fluidic communication with the housing inlet port.

21. The method of claim 20, wherein coupling the first manifold with the first housing places the manifold inlet port in communication with the housing inlet port, and simultaneously places the manifold outlet port in communication with the housing outlet port.

22. The method of claim 20, further comprising decoupling the first manifold from the first housing and coupling the first manifold with a second housing.

23. The method of claim 20, further comprising decoupling the first manifold from the first housing and coupling a second manifold with the first housing.

24. The method of claim 20, wherein aligning the manifold coupling features with the housing coupling features includes aligning an asymmetrically configured housing coupling feature with a corresponding asymmetrically configured housing coupling feature.

25. The method of claim 20, further comprising coupling threaded fasteners to the manifold coupling features and the housing coupling features.

\* \* \* \* \*